United States Patent [19]

Kline et al.

[11] Patent Number: 4,556,812

[45] Date of Patent: Dec. 3, 1985

[54] ACOUSTIC RESONATOR WITH AL ELECTRODES ON AN ALN LAYER AND USING A GAAS SUBSTRATE

[75] Inventors: Gerald R. Kline; Kenneth M. Lakin, both of Ames, Iowa

[73] Assignee: The United States of America as represented by the United States Department of Energy, Washington, D.C.

[21] Appl. No.: 632,165

[22] Filed: Jul. 18, 1984

Related U.S. Application Data

[62] Division of Ser. No. 541,608, Oct. 13, 1983, Pat. No. 4,502,932.

[51] Int. Cl.[4] .................................... H01L 41/08
[52] U.S. Cl. ................................. 310/324; 310/320; 310/311
[58] Field of Search ............... 310/311, 324, 319, 320, 310/338; 357/26

[56] References Cited

U.S. PATENT DOCUMENTS

| | | | |
|---|---|---|---|
| 3,486,046 | 12/1969 | Zalar | 310/311 X |
| 3,568,108 | 3/1971 | Poirier et al. | 310/319 X |
| 4,189,516 | 2/1980 | Dryburgh et al. | 310/313 B |
| 4,214,018 | 7/1980 | Halon et al. | 427/100 |
| 4,302,408 | 11/1981 | Ichihara | 264/22 |
| 4,345,176 | 8/1982 | Grudkowski | 310/313 B |
| 4,456,850 | 6/1984 | Inoue et al. | 310/324 |
| 4,480,488 | 11/1984 | Read et al. | 310/330 X |

OTHER PUBLICATIONS

Aluminum Nitride Thin Film and Composite Bulk Wave Resonators, Lakin et al., 36th Ann. Freq. Control Symposium, 1982.

Selective Etching of GaAs Crystals in $H_2SO_4$—$H_2O_2$—$H_2O$ Systems, Iida et al., Electrochem. Society, #118, p. 768, May 1971.

Localized GaAs Etching with Acidic Hydrogen Peroxide Solutions, by Shaw, J. Electrochem. Society, #128, p. 874, Apr. 1981.

Low-Temperature Coefficient Bulk Acoustic Wave Composite Resonators, Wang et al., Appl. Phys. Lett., #40(4), p. 308, Feb. 15, 1982.

$ZnO/SiO_2$ Diaphragm Composite Resonator on a Silicon Wafer, Nokamura et al., Elect. Lett., #17 (14), p. 507, Jul. 9, 1981.

Cadmium Sulphide and Zinc Oxide Thin-Film Transducers, Foster et al., IEEE Trans. on Sonics and Ultrasonics, vol. 15, No. 1, p. 28, Jan. 1968.

Springer et al., J. Vac. Sci. Technol., #20, 1981, p. 507.

*Primary Examiner*—Mark O. Budd
*Attorney, Agent, or Firm*—James W. Weinberger; Walter L. Rees; Judson R. Hightower

[57] ABSTRACT

A method of fabricating an acoustic wave resonator wherein all processing steps are accomplished from a single side of said substrate. The method involves deposition of a multi-layered Al/AlN structure on a GaAs substrate followed by a series of fabrication steps to define a resonator from said composite. The resulting resonator comprises an AlN layer between two Al layers and another layer of AlN on an exterior of one of said Al layers.

9 Claims, 4 Drawing Figures

4,556,812

ACOUSTIC RESONATOR WITH AL ELECTRODES ON AN ALN LAYER AND USING A GAAS SUBSTRATE

CONTRACTUAL ORIGIN OF THE INVENTION

The U.S. Government has rights in this invention pursuant to Contract No. W-7405-ENG-82 between the U.S. Department of Energy and Iowa State University.

This is a division of application Ser. No. 541,608 filed Oct. 13, 1983, now U.S. Pat. No. 4,502,932.

BACKGROUND OF THE INVENTION

This invention relates to an acoustic resonator and a method of making said resonator. More particularly, this invention relates to a method of making said resonator wherein all processing steps are accomplished from a single side of its supporting substrate.

In recent years much attention has been devoted to the development of microelectronic circuit components. Piezoelectric materials in the form of deposited films have been used in microelectronic resonators, transducers, and other devices. These films are typically deposited on silicon substrates having doped p+ silicon membranes. However, p+ silicon membranes can be problematic during integration of the devices into active circuits.

Semi-insulating GaAs is useful as a substrate material in electronic devices. Its high electron mobility is advantageous in high speed transistors, integrated circuits, broad band amplifiers, and power field-effect transistors. However, a need exists for miniature passive resonators which can be incorporated into these active circuits. In particular, it would be desirable to be able to produce these resonators directly on a GaAs substrate which already supports other electronic components to facilitate circuit integration. It would further be desirable to be able to accomplish all the processing steps from a single side of the substrate.

SUMMARY OF THE INVENTION

It is thus one object of the invention to provide an acoustic resonator which may be integrated with active devices on a GaAs substrate.

It is another object of the invention to provide a method of making such a resonator.

It is yet another object of the invention to provide a method of making such a resonator wherein all processing steps are accomplished from a single side of said GaAs substrate.

Additional objects, advantages, and novel features of the invention will be set forth in part in the following description.

In accordance with the invention, a resonator is provided comprising two essentially parallel layers of Al electrodes, separated by an excitation layer of AlN therebetween, and a shielding layer of AlN supported on the exterior surface of one of said electrodes. The fundamental resonant frequency is a function of the thickness of the composite structure. The shielding layer is of sufficient thickness to protect the electrode adjacent thereto during resonator fabrication. It is also sufficiently thick to act as a control for spurious transduction during resonator operation.

The resonator is made by sputter depositing alternating layers of AlN and Al onto a GaAs substrate. This is accomplished by sputtering an Al target in an atmosphere which is alternated between $N_2$, in which case AlN is deposited, and Ar, in which case Al metal is deposited. The layers are deposited consecutively without opening the system to the environment so that the purity of the system can be maintained. The shielding AlN layer is deposited first, then an Al layer, then the excitation AlN layer, and finally another Al layer. After deposition, the multi-layered structure is processed in several steps to fabricate a resonator. An electrode is defined in the last-deposited Al layer. Then a cavity is provided through the multi-layered composite to provide access to the GaAs substrate. Finally a selective etchant is added through the cavity to remove the GaAs opposite the defined Al electrode, such that the resulting resonator is a shelf-like multi-layered structure supported at its periphery by GaAs. By this method all processing steps can be accomplished by working from a single side of the substrate.

DETAILED DESCRIPTION OF THE INVENTION

The following is a description of a preferred embodiment of the invention. Other embodiments will be readily apparent to those skilled in the art.

Figure 1:
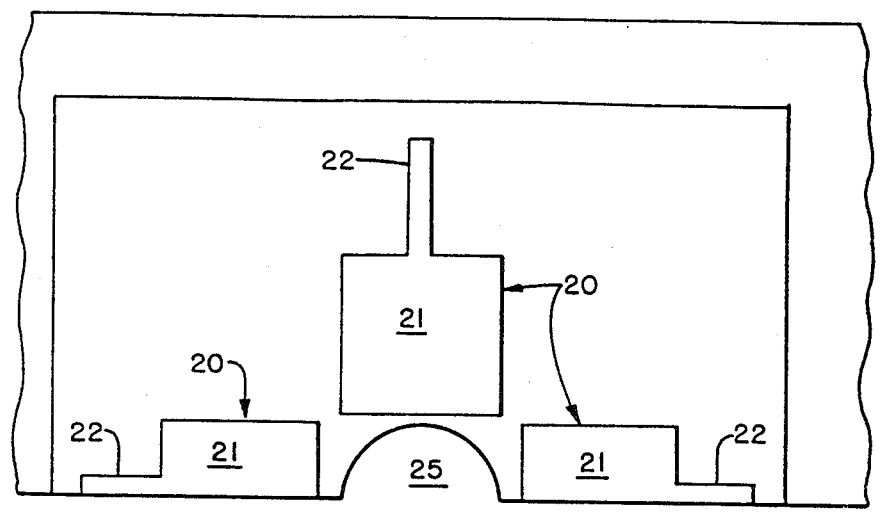
FIG. 1 is a plan view of the cross-sectioned structure of FIG. 2.
Figure 2:
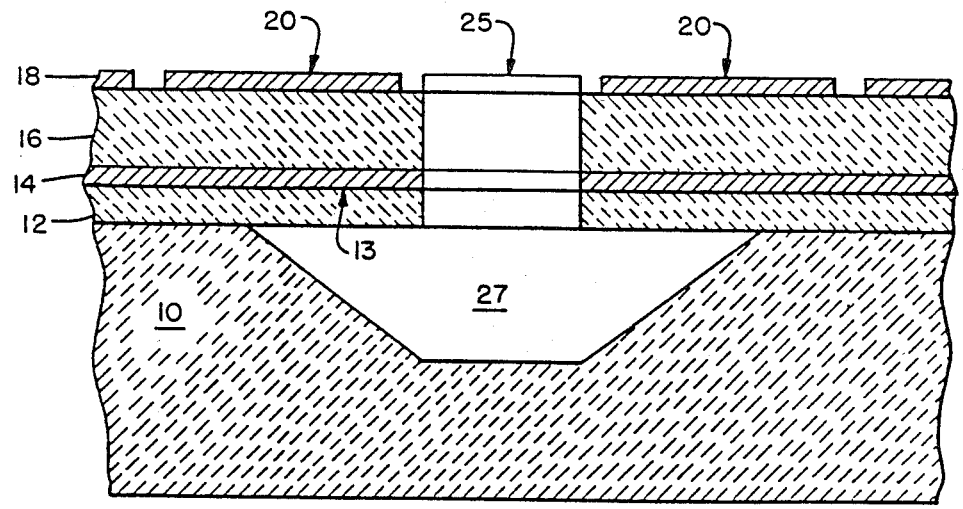
FIG. 2 is a cross-section elevational view of resonators fabricated by the method of the instant invention.

The instant invention is readily understood by reference to FIGS. 1 and 2, which illustrate the multilayered structure of the inventive resonator deposited on a GaAs structure. A GaAs substrate 10 is shown on which are deposited a first layer 12 of AlN, a second layer 14 of Al, a third layer 16 of AlN, and a fourth layer 18 of Al. Electrode layers 14 and 18 are of such thickness as to provide sufficient electrical conductivity to facilitate resonator operation, and are typically about 0.10–0.20 $\mu$m thick. Layer 16 of AlN is a piezoelectric material which resonates at a specific frequency in response to an electric field imposed by the electrodes, the resonating frequency being a function of the thickness of layer 16. Layer 16 is typically about 1.0–25.0 $\mu$m thick, which results in fundamental frequencies ranging from greater than about 1.0 GHz to less than about 200 MHz. Layer 12 of AlN is of sufficient thickness to protect layer 14 during the etching process as will be described. Layer 12 is also sufficiently thick to act as a control for spurious transduction during resonator operation. Layer 12 is typically about 0.5 $\mu$m thick.

The resonator of the instant invention is fabricated by deposition of alternating layers of AlN and Al on a GaAs substrate in a sputtering system, such as a reactive dc magnetron sputtering system. A GaAs substrate and an Al target are provided in the chamber of the sputtering system. The GaAs substrate is preferably a single crystal with a (100) orientation, and the Al target is preferably 99.999% pure. The deposition is advantageously carried out at a relatively low substrate temperature, generally 110° C. or lower. The Al target is sputtered in an atmosphere which is alternated between $N_2$ and Ar by means known in the art, such that $N_2$ is provided to the chamber for deposition of AlN, and Ar is provided to the chamber for deposition of Al. The method thereby allows deposition of alternating AlN and Al layers without opening the chamber to the environment, which is advantageous in that it allows the exclusion of oxygen, a major impurity of Al and Al compounds, from the sputtering chamber.

The deposition may be done on a GaAs substrate which already supports other microelectronic devices. These devices may be protected during the deposition by masking, either by means of a photo-resist or by providing a shield between the target and substrate during deposition, the shield having an aperture through which the sputtered material is deposited. These techniques are known in the art. The relatively low substrate temperature during deposition also prevents heat damage to any pre-existing devices.

An acoustic resonator is then fabricated from the deposited multi-layer composite. The first step is the definition of an Al electrode from layer 18. The area of layer 18 in which an electrode is desired is masked as is known in the art, then the unmasked portions of layer 18 are removed, thereby defining the layer 18 electrode. FIGS. 1 and 2 illustrate an embodiment formed by the method of the invention wherein several resonators are being fabricated from a single multi-layered composite. In FIG. 1, electrodes 20 comprise pad 21 which may typically measure 200 $\mu m \times 200$ $\mu m$ and lead 22 by which the resonator may be integrated with other circuit components on the substrate. The unmasked portions of layer 18 may be removed by means such as ion milling, or preferably by chemical etching. The etchant used to define electrode 20 must etch Al metal but not AlN. Suitable etchants for this step include dilute HF, for example about 10%, or a solution of $H_3PO_4$—$CH_3COOH$—$HNO_3$, which may be combined for example in a ratio of 4:4:1.

After the electrode 20 has been defined, a cavity 25 is provided adjacent thereto and extending through layers 16, 14 and 12 to provide access to GaAs substrate 10. Although other known techniques such as ion milling are available, this step is also preferably accomplished by chemical etching. The etchant for this step must be one that etches both Al and AlN, but not the photoresist or other masking material. The preferred etchant is very dilute NaOH solution, for example about one part NaOH to 800 parts $H_2O$ by weight.

Finally, an etchant is provided through cavity 25 to GaAs substrate 10 to etch away the portion of GaAs opposite electrode pad 21. The etchant carves a generally pyramidal-shaped opening 27 opposite pad 21 so that the resulting resonator is a generally shelf-type structure supported at its periphery by the GaAs substrate. All known etchants for GaAs will also etch Al, but GaAs etchants are known which will not etch AlN. An etchant of the latter type is used in this step. Thus AlN layer 12 protects surface 13 of Al layer 14 during the GaAs etching. Such a suitable etchant solution for GaAs is $1H_2SO_4$—$8H_2O_2$—$300H_2O$.

It is seen that the inventive method as described herein allows all processing steps to be accomplished from one side of the GaAs substrate. A major advantage of this one-sided process is that it allows conservation of the substrate area, resulting in higher device density, and facilitating die bonding without contamination of the resonator top surface. Yet another advantage is that the formation of the fragile shelf-type structure is the last processing step in the method. This also facilitates integration of the resonators with other active devices.

Layer 14, which is an electrode of the resonator, may be provided with electrical contact by any of several methods. For example, layer 14 may be capacitatively coupled to electrode 20, as is known in the art. Alternatively, layer 14 could be partially masked by known means during deposition of layers 16 and 18 to leave a portion of layer 14 uncovered, which portion may be provided with electrical contact. Yet another alternative is to deposit layer 14 such that it takes direct contact with another device on the GaAs substrate, as is known in the art.

In another embodiment of the invention, AlN layer 16 may be deposited with its crystallographic C-axis inclined with respect to the resonator normal. This may be done, for example, by having the substrate in an oblique position with respect to the target during deposition, or by applying an electric field to the sputtering chamber during deposition. When this occurs with a material of 6 mm symmetry such as AlN, the deposited film is capable of quasi-shear wave excitation.

Resonators can be characterized in terms of impedance and resonator Q. The impedance Z is determined from the equation $$Z = 50 \frac{1 + \rho}{1 + \rho}$$

where $\rho$ is the reflection coefficient measured as a function of frequency. The resonator Q is a measure of the ratio of energy stored to energy lost and is determined from the computed phase of Z, $Z_\phi$, such that $$Q = \frac{f_r}{2} \left. \frac{dZ_\phi}{df} \right|_{f_r}$$

where $f_r$ is the resonant frequency. This definition of Q follows directly from parallel or series RLC circuits. Because impedance is a property of the resonator alone and is not determined by the external circuit, Q determined in this manner is the unloaded or device Q.

EXAMPLE I

Figure 3:
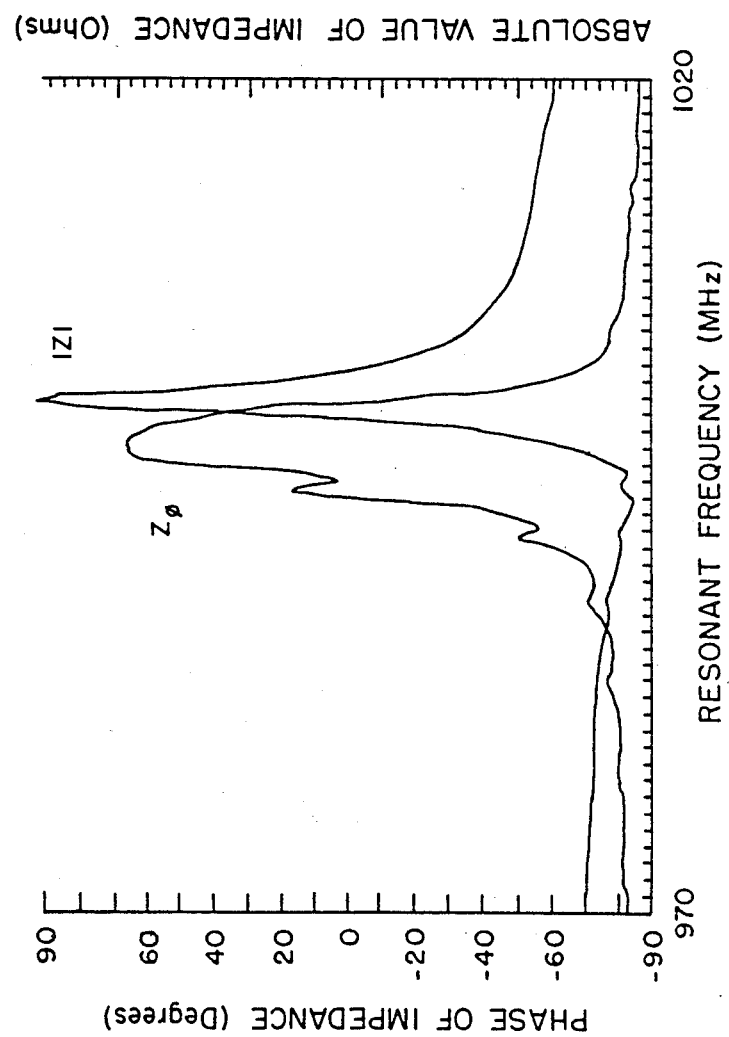
FIG. 3 is a graph of the absolute values of impedance and phase as a function of frequency for a longitudinal mode resonator of the instant invention.
Figure 4:
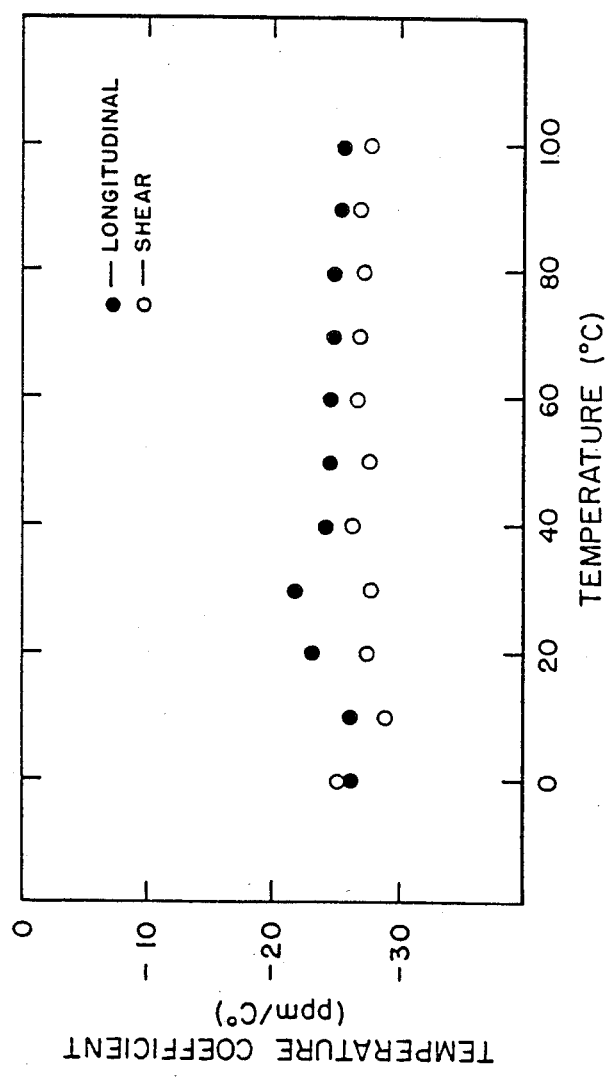
FIG. 4 is a graph of the temperature coefficient of resonance as a function of temperature for both longitudinal and shear wave resonators of the instant invention.

A longitudinal wave resonator was made according to the method of the instant invention. The Al electrodes were 0.2 $\mu m$ thick, the shielding layer of AlN was 0.5 $\mu m$ thick, and the resonating layer was 6.5 $\mu m$ thick. The fundamental series resonance was 994.96 MHz and the fundamental parallel resonance was 1000.21 MHz. Other resonator parameters included Q-series of 802, Q-parallel of 374, series resistance of 10$\Omega$, and parallel resistance of 513$\Omega$. The phase and absolute value of the impedance is plotted as a function of frequency in FIG. 3. The temperature coefficient of resonance was about $-24$ ppm/° C. as shown in FIG. 4.

EXAMPLE II

A shear wave resonator was made in accordance with the method of the instant invention. The resonator layers were of the same thickness as the resonator in Example I. The resonator had a fundamental series resonance of 567.81 MHz and a fundamental parallel resonance of 568.79 MHz. The series Q was 2246, the series resistance was 32$\Omega$ and the parallel resistance was 380$\Omega$. The temperature coefficient of resonance was $-26.5$ ppm/C.° as shown in FIG. 4.

It is to be understood that the resonator parameters set forth above are examples only and are not intended to limit the scope of the invention.

Many modifications and variations will be apparent to those skilled in the art in light of the above teachings. The embodiment was chosen and described in order to best explain the principle of the invention and its practical application.

The embodiments of this invention in which an exclusive property or privilege is claimed are defined as follow:

1. An acoustic wave resonator comprising:
   two aluminum electrodes, essentially parallel to one another,
   an excitation layer of AlN between said electrodes, and
   a shielding layer of AlN supported on the exterior surface of one electrode, said electrodes and AlN layers configured in a shelf-like structure supported by a GaAs substrate at its periphery.

2. The resonator of claim 1 wherein said excitation layer of AlN is of such thickness that the resonator fundamental frequency is in the range of greater than about 1.0 GHz to less than about 200 MHz.

3. The resonator of claim 2 wherein said excitation layer has a thickness between about 1.0 $\mu$m and 25.0 $\mu$m.

4. The resonator of claim 1 where said shielding layer of AlN is of sufficient thickness to protect said supporting Al electrode from a GaAs etchant.

5. The resonator of claim 4 wherein said shielding layer of AlN is further of sufficient thickness to control spurious transduction during resonator operation.

6. The resonator of claim 1 wherein said shielding layer of AlN is about 0.5 $\mu$m thick.

7. The resonator of claim 1 wherein each electrode is of a such thickness as to provide sufficient electrical conductivity to allow device operation.

8. The resonator of claim 7 wherein each electrode has a thickness of about 0.1 $\mu$m–0.2 $\mu$m.

9. The resonator of claim 1 wherein the C-axis of said excitation AlN layer is substantially inclined with respect to the resonator normal, whereby said resonator exhibits shear wave resonance.

* * * * *